(12) United States Patent
Lee et al.

(10) Patent No.: US 6,740,196 B2
(45) Date of Patent: May 25, 2004

(54) RTA CHAMBER WITH IN SITU REFLECTIVE INDEX MONITOR

(75) Inventors: Fu-Su Lee, Tainan (TW); Juin-Jie Chang, Tainan (TW); Ching-Shan Lu, Tainan (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 86 days.

(21) Appl. No.: 10/081,481

(22) Filed: Feb. 21, 2002

(65) Prior Publication Data

US 2003/0155072 A1 Aug. 21, 2003

(51) Int. Cl.[7] ............................ C23F 1/00; H01L 21/306
(52) U.S. Cl. .......................... 156/345.27; 156/345.24; 118/725; 392/411; 392/416; 392/422
(58) Field of Search ....................... 156/345.27, 345.24; 118/725; 392/441, 422

(56) References Cited

U.S. PATENT DOCUMENTS

| | | | | |
|---|---|---|---|---|
| 5,226,732 A | * | 7/1993 | Nakos et al. | ............... 374/133 |
| 5,274,434 A | * | 12/1993 | Morioka et al. | ......... 356/237.4 |
| 5,536,359 A | * | 7/1996 | Kawada et al. | ............... 438/16 |
| 5,581,075 A | * | 12/1996 | Naraki et al. | ............... 250/205 |
| 5,660,472 A | * | 8/1997 | Peuse et al. | ............... 374/128 |
| 5,937,142 A | * | 8/1999 | Moslehi et al. | ............ 392/416 |
| 5,993,059 A | * | 11/1999 | O'Neill et al. | .............. 374/126 |
| 6,077,386 A | * | 6/2000 | Smith et al. | ........... 156/345.24 |
| 6,125,789 A | * | 10/2000 | Gupta et al. | ............. 118/723 E |
| 6,546,820 B1 | * | 4/2003 | Van et al. | ................... 73/865.8 |
| 2003/0052083 A1 | * | 3/2003 | Kim et al. | .................... 216/59 |

* cited by examiner

Primary Examiner—P. Hassanzadeh
Assistant Examiner—Karla Moore
(74) Attorney, Agent, or Firm—Tung & Associates

(57) ABSTRACT

A rapid thermal anneal (RTA) chamber having one or multiple openings in a chamber wall and a reflective index monitor in the opening or openings, respectively. The reflective index monitor or monitors each measures the infrared reflective index of the reflector plate of the rapid thermal anneal chamber, and sends a corresponding signal to a process controller, an alarm, or both a process controller and an alarm. In the event that the measured reflective index of the reflector plate deviates from the reflective index of a control, the process controller terminates heating operation of the chamber to prevent damage to the semiconductor wafer in the chamber. The alarm may be activated to alert personnel to the need for immediate replacement of the contaminated reflector plate.

6 Claims, 2 Drawing Sheets

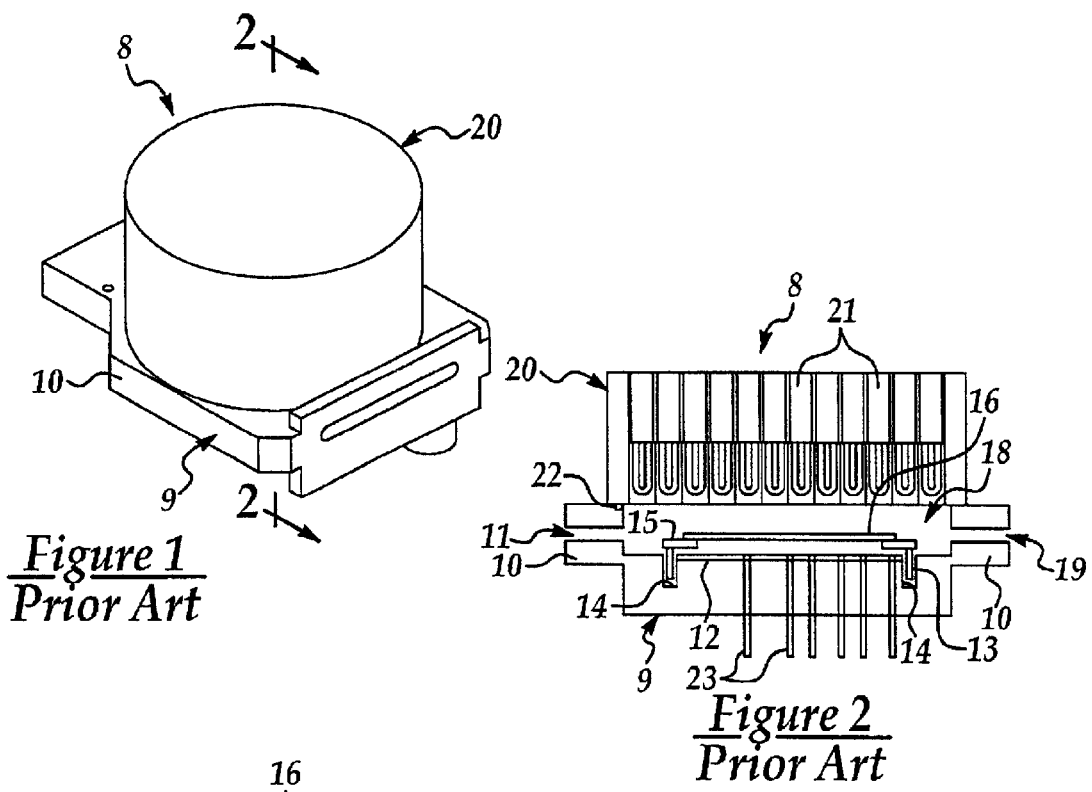
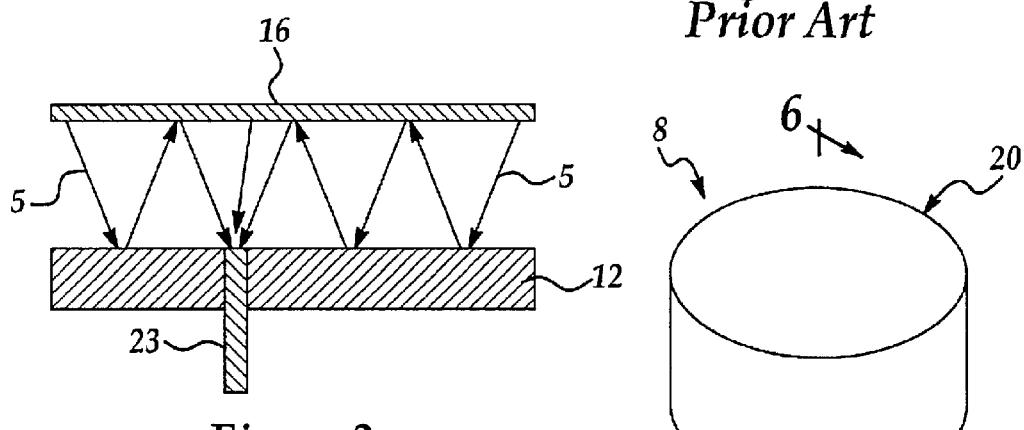
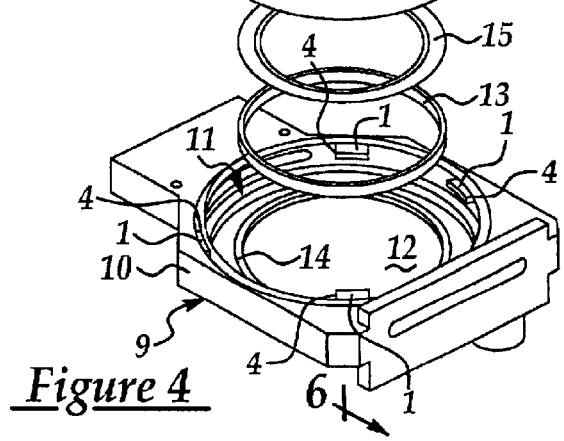

US 6,740,196 B2

RTA CHAMBER WITH IN SITU REFLECTIVE INDEX MONITOR

FIELD OF THE INVENTION

The present invention generally relates to a rapid thermal anneal (RTA) chamber for semiconductor wafers. More particularly, the invention relates to monitoring the reflective index of a reflector plate in-situ in a rapid thermal anneal chamber during thermal processing of semiconductors.

BACKGROUND OF THE INVENTION

Rapid thermal processing (RTP) is frequently used in the semiconductor production industry in the fabrication of semiconductor integrated circuits. Such processing includes rapid thermal oxidation (RTO), which utilizes drastic and abrupt fluctuations in temperature to form a silicon oxide film on a semiconductor wafer or between layers of the wafer. One of the major advantages of using rapid thermal oxidation rather than furnace oxidation in semiconductor processing is that RTO significantly reduces the thermal budget required for transitioning between the low and high temperatures. Moreover, rapid cooling of the oxidizing chamber after a heat-induced oxidizing phase facilitates processing of a greater number of wafers per unit time, significantly enhancing semiconductor production efficiency.

RTP is important for any type of semiconductor wafer processing which requires precise temperature control and short high-temperature process intervals. Consequently, RTP must be carried out in a specially-designed rapid thermal annealing (RTA) chamber, rather than in a conventional semiconductor wafer furnace having walls and other components characterized by high thermal conductivity that would hinder rapid thermal cycling. RTA chambers are designed to thermally isolate a semiconductor wafer such that radiant, rather than conductive, heat is used in semiconductor wafer processing. As a result, all portions of the wafer are more uniformly heated, thereby eliminating or at least reducing thermal gradients which would otherwise cause wafer slip and warpage.

A typical RTA chamber includes an array of halogen, silicon-carbide or arc lamps provided in the upper portion of a sealed chamber. A cylindrical quartz tray for supporting a semiconductor wafer is rotatably mounted in a support in the bottom of the chamber, and a heat reflector plate is provided on the support inside the tray for reflecting heat from the lamps. Infrared pyrometers connected to a temperature control system absorb infrared rays reflected from the peripheral regions to the central region of the reflector plate. Conduits connected to the chamber can be utilized to distribute oxygen or other process gas over the front side of the wafer in the chamber.

During the rapid heating phase of the RTO process, a phenomenon called "dopant outgassing" is common, wherein dopants in the wafer, particularly if the wafer has a low backside emissivity, tend to diffuse from the backside of the wafer and are deposited onto the reflector plate. The dopant contaminants on the reflector plate cause inaccurate heat reflection to the absorptive fiber optic probes of the pyrometers, which relay faulty temperature information to the temperature control for the system. Consequently, overheating of the wafers in the chamber may occur. It is therefore very important during RTP to constantly monitor the reflective index of the reflector plate of a rapid thermal anneal chamber in order to ensure accurate and precise temperature monitoring and control of the chamber during wafer processing.

SUMMARY OF THE INVENTION

Therefore, it is an object of the present invention to ensure accurate and precise temperature control of a rapid thermal anneal chamber.

It is another object of the present invention to detect contaminants on a reflector plate of a rapid thermal anneal chamber.

It is a further object of the present invention to prevent inaccurate or imprecise thermal cycling during the processing of semiconductor wafers in a rapid thermal anneal chamber.

It is yet another object of the present invention to facilitate timely replacement of a reflector plate in a rapid thermal anneal chamber in the event of contaminant deposit on the reflector plate.

It is a still further object of the present invention to facilitate constant monitoring of a reflective index of a reflection plate in a rapid thermal anneal chamber to prevent process temperature errors in operation of the chamber.

In accordance with these and other objects and advantages, the present invention comprises one or multiple openings in the chamber wall of a rapid thermal anneal chamber and a reflective index monitor in the opening or openings, respectively. The reflective index monitor or monitors each measures the infrared reflective index of the reflector plate of the rapid thermal anneal chamber, and sends a corresponding signal to a process controller, an alarm, or both a process controller and an alarm. In the event that the measured reflective index of the reflector plate deviates from the reflective index of a control, the process controller terminates heating operation of the chamber to prevent damage to the semiconductor wafer in the chamber. The alarm may be activated to alert personnel to the need for immediate replacement of the contaminated reflector plate.

BRIEF DESCRIPTION OF THE DRAWINGS

The present invention will now be described, by way of example, with reference to the accompanying drawings, in which:

FIG. 1 is a perspective view of a conventional rapid thermal anneal (RTA) chamber suitable for implementation of the present invention;

FIG. 2 is a cross-sectional view, taken along section lines 2—2 in FIG. 1, of the RTA chamber;

FIG. 3 illustrates reflection of infrared rays between the backside of a semiconductor wafer and the reflector plate component of the RTA chamber, during thermal cycling in conventional operation of the chamber;

FIG. 4 is an exploded, perspective view of an RTA chamber, illustrating implementation of the present invention;

DESCRIPTION OF THE PREFERRED EMBODIMENTS

Figure 5:
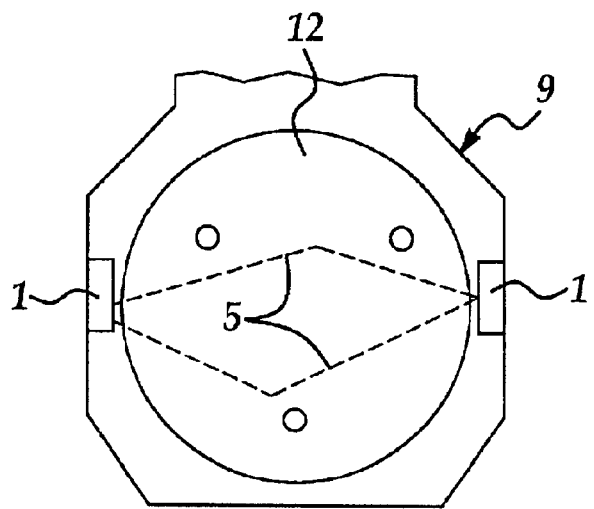
FIG. 5 is a top view, partially in section, of the RTA chamber, with the lamp housing component of the system removed and more particularly illustrating reflection of infrared beams from the reflector plate of the RTA system to the in situ reflective index monitor in application of the present invention.

When used herein, the term reflective index monitor shall be understood to mean any device which is capable of detecting radiation from a surface and determining the reflective index of the surface. When used herein, the term process controller shall be understood to mean any device capable of modulating the operation of a system responsive to data input. When used herein, the term alarm shall be understood to mean any device capable of indicating a condition by audio alarm, video alarm or both responsive to data input.

Advanced logic integrated circuits are fabricated using in excess of 300 fabrication steps. These may include formation of an epitaxial or silicon oxide layer on the front side of the semiconductor wafer. Formation of an epitaxial layer on a semiconductor wafer causes a difference in the doping for the epitaxial layer as compared to that for the silicon wafer substrate on which the epitaxial layer is formed. Rapid thermal oxidation (RTO) is used to form thin oxide films on wafers for electrical insulation or conduction, to activate implanted ions, to form shallow junctions or to alloy contacts, for example.

In order for a rapid thermal oxide layer to be formed on a semiconductor wafer using RTO, the wafer must be subjected to thermal cycling in a rapid thermal annealing (RTA) system. In a thermal cycling process, the wafer is rapidly heated from a low to a high temperature, remains at the high temperature for a short period of time typically ranging from about 1 second to about 5 minutes, and is then rapidly cooled to a low temperature. Typical temperature transition rates during RTO range from 10° C./s to 350° C./s. Oxide layers having a thickness of from 4–40 nm can be formed in a pure oxygen ambient at from 900° C. to 1150° C. for a period of about 15–180 seconds.

A typical conventional rapid thermal anneal (RTA) system is generally indicated by reference numeral 8 in FIGS. 1 and 2, and includes a base 9 having upward-standing chamber walls 10. An annular support cylinder groove 14 is provided in the upper surface of the base 9, inside the chamber walls 10 and receives an annular quartz support cylinder 13. A wafer edge ring 15 is supported by the support cylinder 13 and is adapted for supporting the edges of a semiconductor wafer 16. A lamp housing 20, provided with an array of multiple halogen, silicon carbide, or arc lamps 21, is removably mounted on the chamber walls 10 and encloses the semiconductor wafer 16 in a chamber interior 18. A thin quartz window 22 typically separates the lamps 21 from the chamber interior 18. An upward-facing, circular reflector plate 12, circumscribed by the support cylinder groove 14, is supported on the upper surface of the base 9 for reflecting infrared heat radiation from the lamps 21. The reflector plate 12 is capable of rapid cooling typically by operation of a water-cooling system in the base 9, to rapidly cool the temperature of the chamber interior 18. A gas entry opening 11 and a gas exit opening 19 are typically included in the chamber walls 10 to facilitate flow of a process gas through the chamber interior 18 and deposit of gas components on or reaction of the process gas with the semiconductor wafer 16.

As illustrated in FIGS. 2 and 3, one or multiple fiber optic probes 23 connected to pyrometers (not illustrated) extend through the base 9 and the reflector plate 12, and the pyrometers are connected to a temperature monitor and control system for the lamps 21. During rapid thermal oxidation (RTO), the semiconductor wafer 16 is rapidly heated in the chamber interior 18 typically to a temperature of from 900° C. to 1150° C. by operation of the lamps 21, according to preset operating parameters programmed into the temperature monitor and control system. The wafer 16 remains in that high temperature range for a time interval ranging typically from 15–180 seconds. Simultaneously, gaseous oxygen is delivered into the chamber interior 18 through the gas entry opening 11 and exits the chamber interior 18 through the gas exit opening 19, and oxidizes silicon on the front side of the wafer 16 to form a thin silicon oxide film on the wafer 16. Infrared or heat radiation beams 5 from the lamps 21 penetrate the semiconductor wafer 16 and strike the reflector plate 12, with the frequency or energy level of the infrared beams 5 striking the reflector plate 12 depending upon the emissivity of the wafer 16. The emissivity, or measure of the relative quantities of infrared energy absorbed and reflected by the wafer 16, is highly material- and position-dependent, as various areas of the wafer 16 may include various oxides, polysilicon or other components. After initially striking the reflector plate 12, the infrared beams 5 are reflected back toward the backside of the wafer 16, and strike the backside of the wafer 16 and are reflected back toward the reflector plate 12. Eventually, the infrared beams 5 strike and are absorbed by one of the fiber optic probes 23 of the pyrometers, which measure the temperature of the heat radiating from the wafer 16 and provide continuous data input to the thermal control system for precise temperature control of the wafer 16. Accurate and precise thermal monitoring and control of the rapid thermal anneal chamber 8 is highly dependent upon the reflective characteristics of the reflector plate 12, as measured by the reflective index thereof.

Due to the high temperatures reached by the wafer 16, dopant outgassing, or vaporization of dopant materials from the wafer 16 and deposit of the vaporized materials onto the reflector plate 12 in the form of silicide bridges and coating contamination, frequently occurs. Because these impurities or contaminants on the reflective surface of the reflector plate 12 absorb some of the radiant energy carried by the infrared beams 5 that are reflected between the reflector plate 12 and the backside of the wafer 16, the impurities alter the reflective index of the reflector plate 12. Consequently, the frequency or energy level of the infrared beams 5 reflected from the contaminated portion or portions of the reflector plate 12 is somewhat lower than what the frequency or energy level would have been had the infrared beams 5 reflected directly from the reflector plate 12. As a result, the pyrometers interpret the lower-frequency, decreased radiant energy of the attenuated infrared beams 5 as a corresponding drop in temperature of the wafer 16 and relay this data to the thermal control system for the lamps 21. The thermal control system increases the operational intensity of the lamps 21, resulting in overheating of and damage to the wafer 16. Current methods of monitoring the reflective index of the reflector plate 12 include daily offline monitoring and detection by a reflectometer after preventative maintenance on time. However, these methods are typically implemented only periodically, and all wafer lots processed in the RTA chamber over the course of an entire day may be adversely affected by the contaminated reflector plate.

Figure 6:
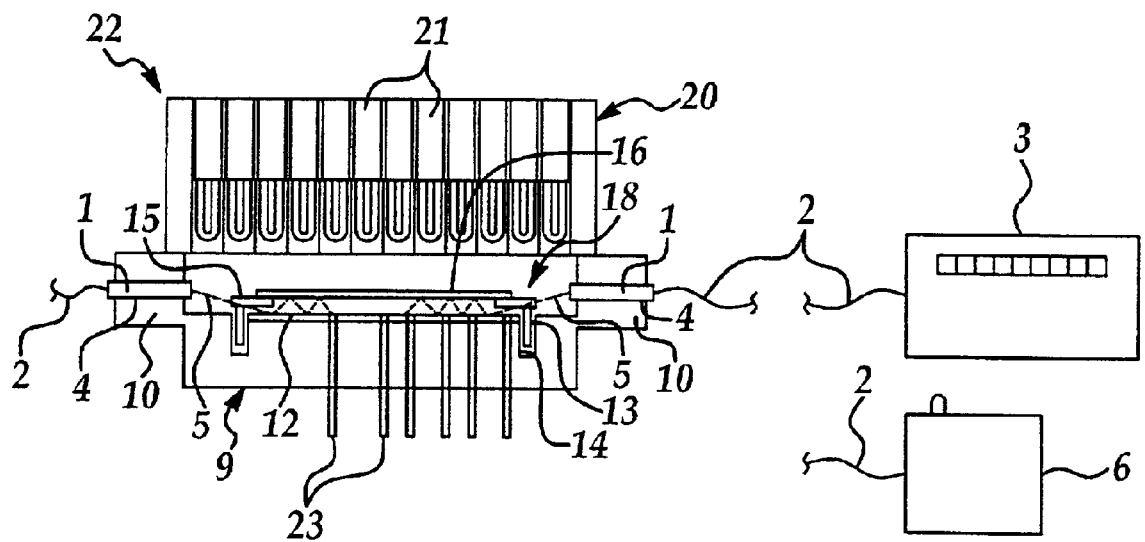
FIG. 6 is a cross-sectional view, taken along section lines 6—6 in FIG. 4, of an RTA chamber which incorporates the present invention.

An application of the present invention is generally indicated by reference numeral 25 in FIGS. 4–6, and includes at least one, and typically, multiple monitor openings 4 extending through the chamber wall 10 around the perimeter of the chamber interior 18. An infrared-sensing reflective index monitor 1, capable of measuring the actual reflective index of the reflector plate 12 and comparing that reflective index to a control standard for the reflective index of the reflector plate 12, is mounted in each monitor opening 4 and is connected to a process controller 3 by means of wiring 2. The process controller 3 is, in turn, wired to the control system for the lamps 21 of the RTA system 25, according to the knowledge of those skilled in the art. Accordingly, as illustrated in FIGS. 5 and 6, during operation of the RTA system 25, infrared beams 5 emanating from the lamps 21 are reflected from the surface of the reflector plate 12 and strike the reflective index monitor or monitors 1. Data which indicate the frequency or energy level of the infrared beams 5 and thus, the reflective index of the reflector plate 12, is compared with the standard value for the reflective index of the reflector plate 12. Any discrepancy in frequency or energy values between the data from the reflector plate 12 and the control data indicates the presence of contaminant deposits on the reflector plate 12, and this information is relayed to the process controller 3. The process controller 3, in turn, terminates operation of the lamps 21 in the RTA system 25 to prevent overheating of the semiconductor wafer in the chamber interior 18.

As further illustrated in FIG. 6, in another embodiment, the reflective index monitor or monitors 1 can be wired to an alarm 6, which can be an audio alarm, a visual alarm, or both. The discrepancy in reflector index values between that of the reflector plate 12 and the control data is thus relayed to the alarm, which alerts to personnel audibly or visually, or both, that contaminants are present on the reflector plate 12. In that event, personnel have sufficient warning to terminate operation of the RTA system 25 before overheating of and damage to the wafer 16 occurs. The contaminated reflector plate 12 can be removed and replaced by an uncontaminated reflector plate 12 to prevent thermal damage to subsequent batches of wafers 16.

In still another embodiment, the alarm 6 is connected to the process controller 3 such that data from the reflective index monitor or monitors 1 indicating the presence of contamination on the reflector plate 12 is relayed to both the process controller 3 and the alarm 6. Accordingly, the process controller terminates operation of the lamps 21 while the alarm 3 alerts personnel to the need for replacing the reflector plate 12.

While the preferred embodiments of the invention have been described above, it will be recognized and understood that various modifications may be made in the invention and the appended claims are intended to cover all such modifications which may fall within the spirit and scope of the invention.

Having described my invention with the particularity set forth above, We claim:

1. A rapid thermal anneal system with reflective index monitor, comprising:
   a chamber wall defining a chamber interior;
   a reflector plate provided in said chamber interior;
   a plurality of lamps provided in said chamber interior above said reflector plate;
   at least one monitor opening provided in said chamber wall;
   a reflective index monitor provided in said at least one monitor opening, respectively, for monitoring a reflective index of said reflector plate;
   a process controller operably connected to said reflective index monitor and said plurality of lamps; and
   wherein said reflective index monitor sends a signal to said process controller and said process controller terminates operation of said plurality of lamps when said reflective index of said reflector plate deviates from a reflective index of a control value.

2. The rapid thermal anneal system of claim 1 wherein said at least one monitor opening comprises a plurality of monitor openings.

3. The rapid thermal anneal system of claim 1 further comprising an alarm operably connected to said at least one reflective index monitor for receiving a signal from said reflective index monitor when said reflective index of said reflector plate deviates from said reflective index of said control value.

4. The rapid thermal anneal system of claim 3 wherein said at least one monitor opening comprises a plurality of monitor openings.

5. A rapid thermal anneal system with reflective index monitor, comprising:
   a chamber wall defining a chamber interior;
   a reflector plate provided in said chamber interior;
   a plurality of lamps provided in said chamber interior above said reflector plate;
   at least one monitor opening provided in said chamber wall;
   a reflective index monitor provided in said at least one monitor opening, respectively, in a substantially elevated position with respect to said reflector plate for monitoring a reflective index of said reflector plate;
   an alarm operably connected to said reflective index monitor; and
   wherein said reflective index monitor sends a signal to said alarm when said reflective index of said reflector plate deviates from a reflective index of a control value.

6. The rapid thermal anneal system of claim 5 wherein said at least one monitor opening comprises a plurality of monitor openings.

* * * * *